Jan. 28, 1964 R. H. BERGMAN 3,119,936
PULSE REGENERATOR WITH NEGATIVE RESISTANCE DIODE BIASED IN
HIGH-VOLTAGE BY INDUCTOR AND CONSTANT-VOLTAGE SOURCE
Filed June 7, 1960

INVENTOR.
RICHARD H. BERGMAN
BY
Carl V. Olson
ATTORNEY 3,119,936

PULSE REGENERATOR WITH NEGATIVE RESISTANCE DIODE BIASED IN HIGH-VOLTAGE BY INDUCTOR AND CONSTANT-VOLTAGE SOURCE

Richard H. Bergman, Riverton, N.J., assignor to Radio Corporation of America, a corporation of Delaware
Filed June 7, 1960, Ser. No. 34,457
9 Claims. (Cl. 307—88.5)

This invention relates to a pulse regenerator circuit to which a weak or poorly-shaped input pulse or trigger pulse may be applied, and from which an amplified and reformed output pulse may be derived. The duration and shape of the output pulse is determined by the values and characteristics of the circuit elements, one of which is a negative resistance diode, commonly known as a tunnel diode. The circuit may be described as a monostable circuit having a predetermined "on" time followed by a predetermined "recovery" time.

Pulse regenerator circuits are useful in many electronic fields, including the communications field, and are particularly useful in the electronic computer and data processing fields, where information passing through successive logic circuits is generally in the form of the presence or the absence of a pulse. There are many points in an electronic data processing system where the information pulses may be reformed, both in amplitude and duration.

Tunnel diodes are especially useful in computers and data processing systems because they have low-voltage and high-voltage positive resistance regions, and an intervening negative resistance region.

It is the general object of this invention to provide a pulse regenerator circuit, including a tunnel diode, and having improved performance characteristics, particularly as regards the shape of the output pulse, the ratio of the "on" time to the "recovery" time, and the stability of operation, or, stated another way, the ability to operate reliably with circuit elements having looser tolerances.

In accordance with the teachings of the present invention, a pulse regenerator circuit is provided which includes an inductor and a tunnel diode connected in series. A substantially constant-voltage bias source is connected across the series combination to forwardly bias the diode, the bias source being designed to bias the tunnel diode in the high voltage valley of its current-voltage characteristic curve. Means are provided to apply an input or trigger pulse to the connection between the inductor and the diode, the input pulse having a polarity which acts on the diode in a direction the reverse of that of the bias source. Means are provided to derive an output signal from the same connection to which the input pulse is applied. The reverse polarity input or trigger pulse causes a cycle of operation of the tunnel diode circuit which results in an output pulse of the same polarity as the input pulse but having increased amplitude, a substantially flat top, and a duration which is only a little less than the duration of the subsequent recovery time of the circuit. According to a modification of the invention, a small inductor is placed in series with the output lead of the circuit for the purpose of increasing the logic gain and facilitating switching when the utilization circuit connected to the output of the pulse regeneration circuit presents a relatively heavy load.

These and other objects and aspects of the invention will be apparent to those skilled in the art from the following more detailed description given in conjunction with the appended drawing wherein.

Figure 1:
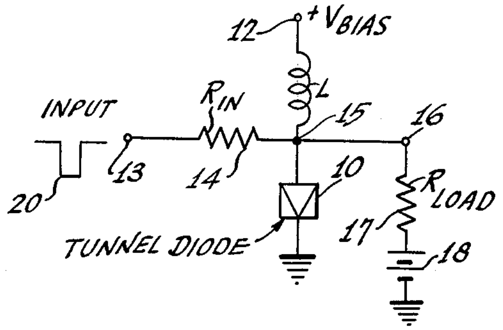
FIGURE 1 is a pulse regenerator circuit constructed according to the teachings of the invention and adapted for receiving and delivering negative polarity pulses.

FIGURE 1 shows a pulse regenerator circuit including a negative resistance or tunnel diode 10 connected in series with a non-linear impedance or inductor L. The series circuit is supplied with a bias voltage from a relatively constant voltage source (not shown) having a positive terminal at 12 and a negative terminal at ground or point of reference potential. The substantially constant voltage characteristic of the source is achieved by making the internal resistance of the source appropriately small in relation to the resistance of the circuit including the inductor L and the tunnel diode 10. The polarity of the source is such as to bias the tunnel diode 10 in the forward direction.

Means are provided to apply a negative input or trigger pulse to an input terminal 13 from which it is applied through an input resistor 14 to the junction point 15 in the conductive path between the inductor L and the tunnel diode 10. An output signal is obtained from an output terminal 16 which is connected to the junction point 15 and also is connected through a load resistor 17 and a battery 18 to ground or point of reference potential. The resistor 17 and the battery 18 represent the equivalent circuit of the utilization device which is connected to the output terminal 16 to utilize the output of the pulse regenerator circuit. It will be understood that the utilization device may or may not include the voltage source 18.

By way of example only, a circuit according to FIGURE 1 may be constructed using a germanium tunnel diode having a peak current of 20 milliamperes, and a voltage bias source of 380 millivolts. The input resistor 14 and load resistor 17 may have values of 100 ohms and 47 ohms, respectively, to provide a logic gain of two. The inductor L may have a value of 20 millimicro henries.

Figure 2:
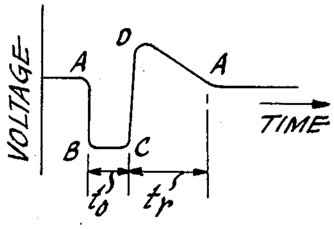
FIGURE 2 is a diagram of the output voltage waveform of the circuit of FIGURE 1.

A negative input pulse 20, which may have a voltage value of 300 millivolts, is applied to the input terminal 13 to trigger the pulse regenerator circuit into operation. The output pulse, also of negative polarity, derived from the output terminal 16 is as shown in FIG. 2. The output pulse may be of greater amplitude than the input pulse. The duration of the output pulse is not limited to the duration of the input pulse but has a longer duration determined by the values and characteristics of the circuit elements of the pulse regenerator circuit.

Figure 3:
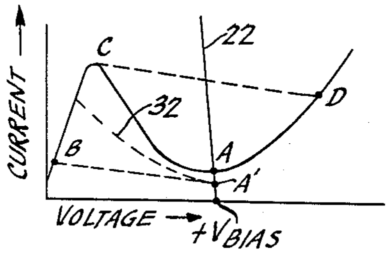
FIGURE 3 is a diagram of the current-voltage characteristics of a tunnel diode which will be referred to in describing the operation of the circuit of FIGURE 1.

For a description of the operation of the circuit of FIG. 1, reference will be made to the diagram of FIG. 3 which shows the static current-voltage characteristic of the tunnel diode. It will be noted that the current-voltage characteristic curve rises sharply from the origin of the graph to a peak at the point C. The portion of the curve between the origin and the point C represents the low voltage, positive resistance region of the diode. The diode exhibits a negative resistance in the region from C to A. The portion of the curve from A to D and beyond represents the high voltage, positive resistance region of the diode. The source of bias potential applied to terminal 12 of the circuit of FIG. 1 is designed to provide the load line 22 shown in FIG. 3. The fact that the bias source is a substantially constant voltage source is represented by the fact that the line 22 approaches being a vertical line which intersects the characteristic curve at only one point A. The load line 22 can have a greater slope than that shown, but not so much that it intersects the characteristic curve at more than one point. The magnitude of the bias source is such that the load line 22 intersects the characteristic curve at the point A in the high voltage valley of the characteristic curve of the diode. Therefore, the point A represents the quiescent condition of the diode 10 in the circuit of FIG. 1 when the bias source is connected, and in the absence of any input signal.

The diode 10 in FIG. 1 is represented by a symbol including an arrowhead pointing in the direction of positive current flow. When the negative input pulse 20 is applied through the input resistor 14 to the diode 10, the input signal reduces the current in the diode sufficiently to cause the operating state of the diode to switch to the low voltage region of the characteristic curve. In the switching process, the nature of the input pulse and the distributed or inherent capacitance of the tunnel diode may cause instantaneous movement of the operating point from A to A′, before it follows along the dashed line to the low voltage stable operating point B. The foregoing switch in the operation of the diode occurs in coincidence with the leading edge of the input pulse 20, with the result that the leading edge of the output pulse appears at the output terminal 16, as represented by the portion between A and B of the waveform of FIG. 2.

Following the initial triggering or switching of the diode, the operating point of the diode moves along the characteristic curve from the point B to the point C. During this interval, the voltage across the diode decays very slowly at an exponential rate determined primarily by the ratio of the inductance of the inductor L to the average resistance of the diode in the region between B and C of its characteristic curve. This resistance may be in the order of three ohms. (The resistance of the input and load circuits which are in parallel with the diode also affect the time constant but only to a small extent because the resistances of these circuits are high compared to the resistance of the diode.) Since the slope of the curve between B and C is steep, indicating that the resistance of the diode in this region is very low, the width of the output pulse shown in FIG. 2 is relatively large, and the amplitude of the output pulse between points B and C is substantially constant. Stated another way, the output pulse as shown in FIG. 2 is a substantially flat-topped negative pulse.

As the operating point of the diode moves to the right from the point C, the unstable negative-resistance region of the diode is encountered, and the diode switches very rapidly along the dashed line to the point D in the high voltage region of the characteristic curve. This switch of the diode generates the trailing edge C–D of the output waveform of FIG. 2. Thereafter, the operating point of the diode moves along the characteristic curve from the point D to the point A at a rate determined by the inductance of the inductor L divided by the effective resistance of the diode in the region between points A and D of its characteristic curve. In this region, the average resistance of the diode is greater than it is in the region between B and C, as indicated by the average slopes of the respective regions of the characteristic curve. The nature of the output signal during the shift in operation from the point D to the point A is represented by corresponding letters in the waveform of FIG. 2.

The waveform of FIG. 2 illustrates that the output signal consists of a negative pulse having a duration $t_o$ which occurs during the "on" time of the diode. The negative pulse is followed by a "recovery" period having a duration $t_r$. It will be observed that the "on" time $t_o$ is the same order of magnitude as the "recovery" time $t_r$. It has been found in practice that the "recovery" time $t_r$ is only one and a half or two times as great as the "on" time $t_o$. This represents a marked improvement, compared with prior art circuits which provide an output pulse that is of relatively very short duration compared with the recovery time. In a circuit constructed according to FIGURE 1 including a germanium tunnel diode biased to approximately 300 millivolts, the output pulse had a duration of 1 milli-microsecond and the recovery time was 1.5 milli-microseconds.

Figure 4:
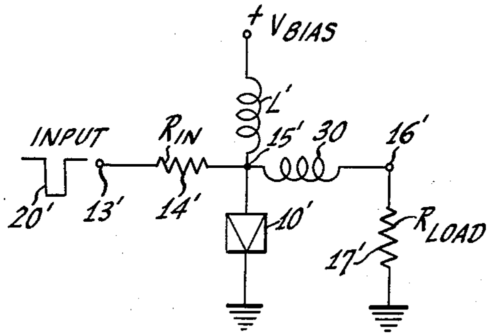
FIGURE 4 is a pulse regenerator circuit according to the invention but differing fom that of FIGURE 1 in that a small inductor is added in series with the load for the purpose of increasing the logic gain and switching characteristic of the circuit.

FIGURE 4 shows a pulse regenerator circuit similar to that of FIG. 1 but differing therefrom in that the small inductor 30 is added in series with the load resistor 17′ for the purpose of increasing the logic gain of the circuit, and to facilitate the operation of the circuit when it is connected to a utilization circuit or output load 17 which presents a relatively high load (e.g., when the load resistor 17 is of relatively low resistance). The inductor 30 may have a value of 5 milli-micro henries, and may be constituted by a short conductor. The addition of the inductor 30 causes the operating point of the diode to move from the point A′ in FIG. 3 along the dashed line 32, rather than along the dashed line from A′ to B. This results in a greater logic gain than is provided by the circuit of FIG. 1, so that a circuit according to FIG. 4 may provide a logic gain of three. A tunnel diode circuit having a logic gain of three is one which has an output signal capable of simultaneously driving three succeeding tunnel diode circuits. Such a circuit may also be described as having a fan-out of three.

If a large amount of gain is required, it will be understood that a plurality of tunnel diode circuits may be connected in cascade. In this instance, a last tunnel diode circuit in the cascade should be biased after the manner illustrated in FIG. 3 for the purpose of obtaining the desired output waveform. The preceding tunnel diode circuits in the chain may be differently biased so that the load line intersects the characteristic curve in the region between B and C, since the shape of the output waveform from each circuit prior to the final circuit is unimportant and is utilized solely for triggering the succeeding stage.

Figure 5:
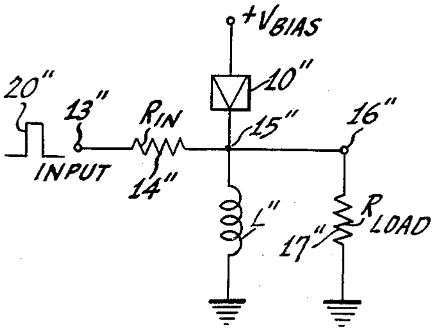
FIGURE 5 is a circuit diagam of a pulse regenerator circuit according to the invention but differing from that shown in FIGURE 1 in that it is adapted to receive and deliver pulses of positive polarity.
Figure 6:
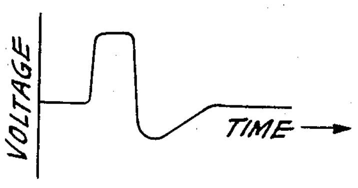
FIGURE 6 is a diagram of the output voltage waveform of the circuit of FIGURE 5.

FIG. 5 shows a pulse regenerator circuit according to the invention which differs from those of FIGS. 1 and 4 in that it is adapted to receive a positive polarity input or trigger pulse and to provide a positive polarity output pulse. The circuit of FIG. 5 is similar to that of FIG. 1 except that the positions of the tunnel diode 10″ and the inductor L″ are reversed so that the input signal is applied across the inductor L″ rather than across the tunnel diode 10. As before, the tunnel diode 10″ is biased in a forward direction, and the positive input pulse 20″ has a polarity in the reverse direction so that it reduces the current in the diode sufficiently to cause the operating state of the diode to switch to the low voltage region of the characteristic curve. A positive regenerated output pulse, as represented in FIGURE 6, is obtained at the output terminal 16″. Except for the reversal in the polarity of the input and output signals, the operation of the pulse regenerator circuit of FIG. 5 is the same as that already described in connection with FIG. 1.

It is apparent that according to this invention there is provided a pulse regenerator circuit including a tunnel diode and providing improved performance in that the output pulses are substantially flat-topped, and in that the duration of the output pulses approaches the duration of the subsequent recovery time. The circuits according to the invention are also very advantageous in that the mode of biasing the diodes in the valley of the characteristic curve relieves the close tolerances otherwise required of the diodes employed, and relieves the tolerances on the bias voltage source. It can be seen by reference to FIG. 3 that variations in the value of bias voltage applied, or variations in the characteristics of the particular tunnel diodes employed, has very little effect on the operation of the circuit. This desirable characteristic of applicant's circuit is in marked contrast to prior art circuits wherein the tunnel diodes are biased in the low voltage region of the characteristic curve with the result that slight differences in bias voltages or tunnel diode characteristics can result in erratic and unsatisfactory operation.

What is claimed is:

1. A pulse regenerator circuit comprising a negative resistance diode and an inductor connected in series, said diode having a current-voltage characteristic including a high voltage valley region, a bias voltage source connected across said series-connected diode and inductor, said bias source providing a bias voltage of a value to quiescently bias the diode in the high voltage valley of the current-voltage characteristic curve of the diode, means to apply an input pulse to said diode, and means to derive a regenerated output pulse from said diode.

2. A pulse regenerator circuit comprising a negative resistance diode and an inductor connected in series, said diode having a current-voltage characteristic including a high voltage valley region, a substantially constant-voltage bias source connected across said series-connected diode and inductor, said bias source providing a bias voltage of a value to quiescently bias the diode in the high voltage valley of the current-voltage characteristic curve of the diode, means to apply an input trigger pulse to the connection between said diode and said inductor, and means to derive a regenerated output pulse from the connection between said diode and said inductor.

3. A pulse regenerator circuit comprising a tunnel diode and an inductor connected in series, a bias source connected across said series-conected inductor and diode, said bias source having a low internal impedance and providing a voltage such that the static load line of the diode current intersects the current-voltage characteristic curve of the diode at only one point, the point being in the high voltage valley region of the curve, means to apply an input trigger pulse to the connection between said inductor and diode, and output means to derive a regenerated output pulse from the connection between said inductor and diode, said input pulse having an amplitude and polarity to reduce the current through the diode and thereby cause the operating point of the diode to switch to the low voltage region of its characteristic curve, whereby a cycle of operation of said circuit is initiated with the result that an output pulse appears at said output means which has a duration and waveform determined by the values and characteristics of the circuit elements.

4. A pulse regenerator circuit comprising an inductor and a tunnel diode connected in series, a substantially constant-voltage bias source connected across said series circuit to forwardly bias the diode in the high-voltage valley of the current-voltage characteristic curve of the diode, means to apply a negative polarity input trigger pulse across said diode to switch the operating point of the diode to a point on the low voltage region of its characteristic curve, and means to derive a reformed output pulse of negative polarity from across said diode.

5. A pulse regenerator circuit comprising a negative resistance diode and an inductor connected in series, said diode having a current-voltage characteristic including a high voltage valley region, a substantially constant-voltage bias source connected across said series circuit to forwardly bias said diode in the high-voltage valley of the current-voltage characteristic curve of the diode, means to apply a positive polarity input trigger pulse across said inductor, and means to derive a regenerated output pulse having the same polarity as the input pulse from across said inductor.

6. A pulse regenerator circuit comprising a tunnel diode and an inductor connected in series, a substantially constant-voltage bias source connected across said series circuit, said bias source providing a bias voltage of a value to quiescently bias the diode in a forward direction in the high-voltage valley of the current-voltage characteristic curve of the diode, means to apply an input trigger pulse to the connection between said diode and said inductor, said input pulse having a polarity and amplitude to switch the operating point of the diode to a point on the low voltage region of its characteristic curve, and a second inductor connected in series from the connection between said diode and said first inductor to a load for coupling the output signal from the pulse regenerator circuit to the load.

7. The combination of a negative resistance diode and a non-linear impedance connected in series, said diode having a current-voltage characteristic including a high voltage valley region, a bias voltage source connected across said series-connected diode and impedance to quiescently bias said diode in the high voltage valley region of its current-voltage characteristic, means to apply an input signal to said diode, and means to derive an output signal from said diode.

8. The combination of a negative resistance diode and a non-linear impedance connected in series, said diode having a current-voltage characteristic including a high-voltage positive-resistance valley region, a bias voltage source connected across said series-connected diode and impedance to quiescently bias said diode in the high-voltage positive-resistance valley region of its current-voltage characteristic, means to apply an input signal to said diode, and means to derive an output signal from said diode.

9. The combination of a tunnel diode and a non-linear impedance connected in series, said diode having a current-voltage characteristic including a high-voltage positive-resistance valley region, a bias voltage source connected across said series-connected diode and impedance to quiescently bias said diode in the high-voltage positive-resistance valley region of its current-voltage characteristic, means to apply an input signal to the junction between said diode and impedance, and means to derive an output signal from the junction between said diode and impedance.

References Cited in the file of this patent

UNITED STATES PATENTS

| | | |
|---|---|---|
| 2,958,046 | Watters | Oct. 25, 1960 |
| 2,975,377 | Price | Mar. 14, 1961 |
| 2,997,604 | Shockley | Aug. 22, 1961 |
| 3,017,613 | Miller | Jan. 16, 1962 |
| 3,061,790 | Theriault | Oct. 30, 1962 |
| 3,062,970 | KamLi | Nov. 6, 1962 |
| 3,075,087 | Lo | Jan. 22, 1963 |
| 3,075,088 | KamLi | Jan. 22, 1963 |

OTHER REFERENCES

"Tunnel Diode Applications," by Carl D. Todd, published by Hughes Semiconductor Division in Application Engineering Notes, dated May 1960.

"Tunnel Diode Circuit Aspects and Applications," by W. F. Chow et al., AIEE Conference Paper CP-297 dated Jan. 1960, pages 7 and 19 relied on.

UNITED STATES PATENT OFFICE
CERTIFICATE OF CORRECTION

Patent No. 3,119,936 January 28, 1964

Richard H. Bergman

It is hereby certified that error appears in the above numbered patent requiring correction and that the said Letters Patent should read as corrected below.

Column 2, line 19, for "a non-linear impedance or" read -- an --; column 3, line 55, for "D" read -- B --; column 6, lines 19 and 20, 29, and 38, for "a non-linear", each occurrence, read -- an --.

Signed and sealed this 30th day of June 1964.

(SEAL)
Attest:

ERNEST W. SWIDER
Attesting Officer

EDWARD J. BRENNER
Commissioner of Patents